(12) United States Patent
Ueda

(10) Patent No.: US 7,579,880 B2
(45) Date of Patent: Aug. 25, 2009

(54) CIRCUIT FOR DRIVING A SEMICONDUCTOR ELEMENT

(75) Inventor: Goro Ueda, Nishio (JP)

(73) Assignee: DENSO CORPORATION, Kariya (JP)

( * ) Notice: Subject to any disclaimer, the term of this patent is extended or adjusted under 35 U.S.C. 154(b) by 154 days.

(21) Appl. No.: 11/723,774

(22) Filed: Mar. 22, 2007

(65) Prior Publication Data

US 2007/0222485 A1 Sep. 27, 2007

(30) Foreign Application Priority Data

Mar. 23, 2006 (JP) ............................. 2006-080774
Oct. 24, 2006 (JP) ............................. 2006-288289

(51) Int. Cl.
*H03K 3/00* (2006.01)
(52) U.S. Cl. ........................................ 327/108; 326/83
(58) Field of Classification Search ................. 327/108, 327/109, 110, 111, 112; 326/82, 83
See application file for complete search history.

(56) References Cited

U.S. PATENT DOCUMENTS

| 5,552,746 | A | 9/1996 | Danstrom | |
|---|---|---|---|---|
| 6,724,227 | B2 * | 4/2004 | Imai | 327/108 |
| 6,788,128 | B2 * | 9/2004 | Tsuchida | 327/427 |
| 7,038,500 | B2 * | 5/2006 | do Nascimento | 327/108 |
| 2005/0231177 | A1 | 10/2005 | Tateno et al. | |

FOREIGN PATENT DOCUMENTS

JP  A-07-111446  4/1995

* cited by examiner

*Primary Examiner*—Kenneth B. Wells
(74) *Attorney, Agent, or Firm*—Posz Law Group, PLC

(57) ABSTRACT

A drive circuit is provided for driving a voltage-driven semiconductor element by producing a drive signal depending upon an input signal. The drive circuit comprises an output stage and a current-suppressing circuit. The output stage includes two semiconductor elements connected in series. The voltage-driven semiconductor element is connected to a common connection point of the two semiconductor elements. The current-suppressing circuit controls one of the two semiconductor elements to provide an output current flowing through either one of the two semiconductor elements if a voltage applied to the voltage-driven semiconductor element reaches a limit level, which is in excess of a level for conducting the voltage-driven semiconductor element by a predetermined voltage.

4 Claims, 11 Drawing Sheets

CIRCUIT FOR DRIVING A SEMICONDUCTOR ELEMENT

CROSS REFERENCE TO RELATED APPLICATION

This application is based on and incorporates herein by reference Japanese Patent Applications No. 2006-80774 filed on Mar. 23, 2006 and No. 2006-288289 filed on Oct. 24, 2006.

FIELD OF THE INVENTION

This invention relates to a drive circuit which outputs a drive signal to a voltage-driven semiconductor element depending upon an input signal.

BACKGROUND OF THE INVENTION

JP 7-111446A discloses a conventional drive circuit. This drive circuit may be exemplified as shown in FIG. 5 or FIG. 6 of the present application.

In a drive circuit for driving a large power MOSFET, as shown in FIG. 5, two N-channel MOSFETs 1 and 2, the sources of which are grounded, have their gates connected in common to receive a drive control signal VIN from an external unit. The drain of the FET 1 is grounded via an emitter of an NPN transistor 3 and a resistor 4, and is further connected to the base of an NPN transistor 5. On the other hand, the drain of the FET 2 is connected to a power source VB via a resistor 6 and is further connected to the base of the transistor 3.

The collector of the transistor 3 is connected to the power source VB via a resistor 7 and is further connected to the base of a transistor 8. The transistor 8 has its collector connected to the power source VB and has its emitter connected to the collector of the transistor 5 via a resistor 9. The emitter of the transistor 8 serves as an output terminal 10 which is connected to the power source via a Zener diode 11 and is further connected to the gate of a P-channel power MOSFET 12. The source of FET 12 is connected to the power source VB, and the drain thereof is grounded via a load 13. The FET 12 thus drives the load at the high potential side. The load 13 may be, for example, a DC motor, a solenoid or a lamp.

In this drive circuit 14, if the drive control signal VIN is of a low level, the FETS 1 and 2 are turned off, and the transistors 3 and 5 are turned on. The transistor 8 is turned off by the transistor 3, the gate of FET 12 assumes the low level, and the FET 12 is turned on to supply a current to the load 13. If the drive control signal VIN assumes a high level, on the other hand, these elements are turned on and off in a reversed manner, and the FET 12 is turned off to interrupt the supply of current to the load 13.

In another drive circuit 16 for driving a N-channel power MOSFET 15 instead of driving the FET 12, as shown in FIG. 6, a series circuit of the load 13 and a FET 15 is connected between the power source VB and the ground. The gate of FET 15 is connected to the collector side of the transistor 5 (low side drive). Further, the Zener diode 11 is connected between the gate of FET 15 and the ground. In the drive circuit 16, the FET 15 is turned off if the drive control signal VIN is at the low level. It is turned on if the control signal VIN is at the high level.

Here, the Zener diode 11 arranged in the output stage of the drive circuits 14, 16 is for preventing an excess of voltage from being applied to the gates of FETs 12, 15. Therefore, the resistor 9, too, is provided in the output stage to limit the current, i.e., to limit the current that flows through the Zener diode 11. Therefore, as a switching frequency for driving the FETs 12, 15 increases, the voltage waveforms across the gate and the source of FETs 12, 15 become less sharp due to the resistor 9, and the FETs cannot be driven at high speeds.

An output current (collector current) I5 in the transistor 5 and voltage Vout change as shown in FIGS. 7 and 8, respectively, when the resistance R9 of the resistor 9 is 180Ω in the drive circuit 14 shown in FIG. 5. The current I5 in the transistor 5 and voltage Vout change as shown in FIGS. 9 and 10, respectively, when the resistance R5 of the resistor 9 is 2 kΩ in the drive circuit 14 shown in FIG. 5. When R5 is 180Ω the current I5 that flows through the transistor 5 is about 30 mA as shown in FIG. 7. When R5 is 2 kΩ, the current can be provided to be about 4 mA as shown in FIG. 9. In this case, however, it will be learned that the breakdown of the gate voltage Vout of FET 12 becomes slower as shown in FIG. 10 than in the case of FIG. 8.

According to JP 7-111446A, further, a diode or a capacitor is provided between the gate of an IGBT (insulated gate bipolar transistor) and the power source of a drive device in a device for driving the IGBT in order to bypass the charging/discharging current of a feedback capacitor to the power source side when the IGBT is to be switched.

This, however, is to prevent erroneous operation (oscillation) of the IGBT relying upon the bypass diode and to provided an increase in the current by clamping the gate voltage. Therefore, the problem cannot be solved even if the above technique is applied to the problem of suppressing the output current while accomplishing a high-speed switching.

U.S. Pat. No. 5,552,746 (JP 8-293774A) also discloses another conventional drive circuit for outputting a drive signal to a voltage-driven semiconductor element. As shown in FIG. 13, this drive circuit is provided with an active voltage clamp circuit for protecting the gate of a power transistor 144 from an excessive electric stress The transistor 144 is connected to transistors 140, 142 and a load.

The active voltage clamp circuit has a current mirror formed by Zener diodes 132, 134 and transistors 136, 138. The diodes 132, 134 are connected to a transistor 130, which is connected to a resistor 129. This resistor is connected in parallel to Zener diodes 127, 128. If a power source voltage VB is lower than a threshold voltage Vth of the following equation, $$Vth = Vth132 + Vth134 + VBE138$$

the active voltage clamp is in the passive state, and the circuit operation is not affected. Conversely, if the current flows through the diodes 132, 134 and the transistor 138, and the voltage VB becomes greater than the Vth voltage, the active voltage clamp is activated. A current flowing through the transistor 138 mirror-operates through the transistor 136 connected to the gate of a transistor 125. As the voltage VB becomes higher than the threshold voltages of diodes 132 and 134, the current starts flowing through the diodes 132 and 134, and mirror-operates through the transistor 136, causing the gate of transistor 125 to assume the low level.

Therefore, the gate potential of a transistor 144 is clamped to a voltage which is the sum of threshold voltages of diodes 132 and 134 and a voltage drop through the transistor 138. The electric current is limited by a feedback loop through a current mirror formed by diodes 132, 134 and transistors 136, 138.

According to the above construction, the gate potential of the transistor 125 is determined by the power source voltage of an inverter 122 connected to an input inverter 120 and a voltage drop through a gate resistor 124. Therefore, when the power source voltage of the inverter 122 varies, the clamp current varies and the consumption of electric power fluctuates.

SUMMARY OF THE INVENTION

It is therefore a first object of the present invention to provide a drive circuit capable of suppressing an increase in an output current and of switching a semiconductor element for large power use at higher speeds.

It is a second object of the present invention to provide a drive circuit capable of suppressing fluctuation in a clamping voltage.

According to a first aspect of the present invention for attaining the first object, a drive circuit is provided for driving a voltage-driven semiconductor element by producing a drive signal depending upon an input signal. The drive circuit comprises an output stage and a current-suppressing circuit. The output stage includes two semiconductor elements connected in series. The semiconductor element that is to be driven is connected to a common connection point of the two semiconductor elements. The current-suppressing circuit controls one of the two semiconductor elements to provide an output current flowing through either one of the two semiconductor elements if a voltage applied to the voltage-driven semiconductor element reaches a limit level, which is in excess of a level for conducting the voltage-driven semiconductor element by a predetermined voltage.

According to a second aspect of the present invention for attaining the second object, a drive circuit is provided for driving a voltage-driven semiconductor element to be conductive depending upon an input signal. The drive circuit has a function for clamping a voltage applied to a conduction control terminal of the semiconductor element when the semiconductor element is rendered conductive. The drive circuit comprises a constant current source, a resistor, a mirror pair and a constant voltage source. The constant current source supplies a constant current. The resistor is supplied with the constant current depending upon the input signal. The mirror pair on an output side determines a current flowing through the conduction control terminal of the semiconductor element. The constant voltage element connected between the conduction control terminal and a potential point that becomes equal to the terminal voltage of the resistor on a current path on a side of a main transistor that forms the mirror pair on the output side. The constant voltage element forms a negative feedback path for a current that flows through the conduction control terminal. The constant current source includes a circuit that is operable independently of temperature and voltage, and the resistor is operable independently of temperature.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
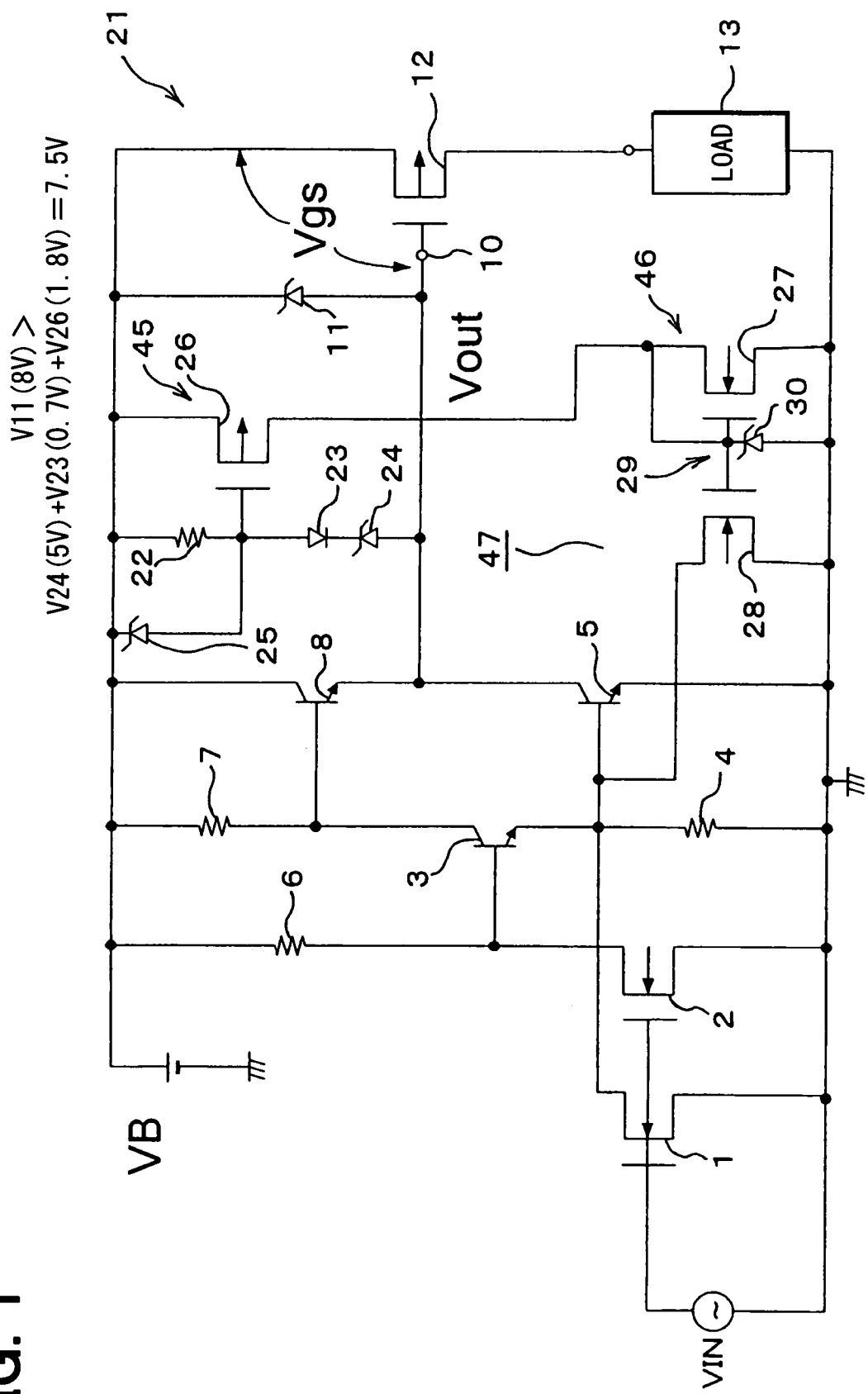
FIG. 1 is a circuit diagram illustrating a drive circuit according to a first embodiment of the present invention.
Figure 5:
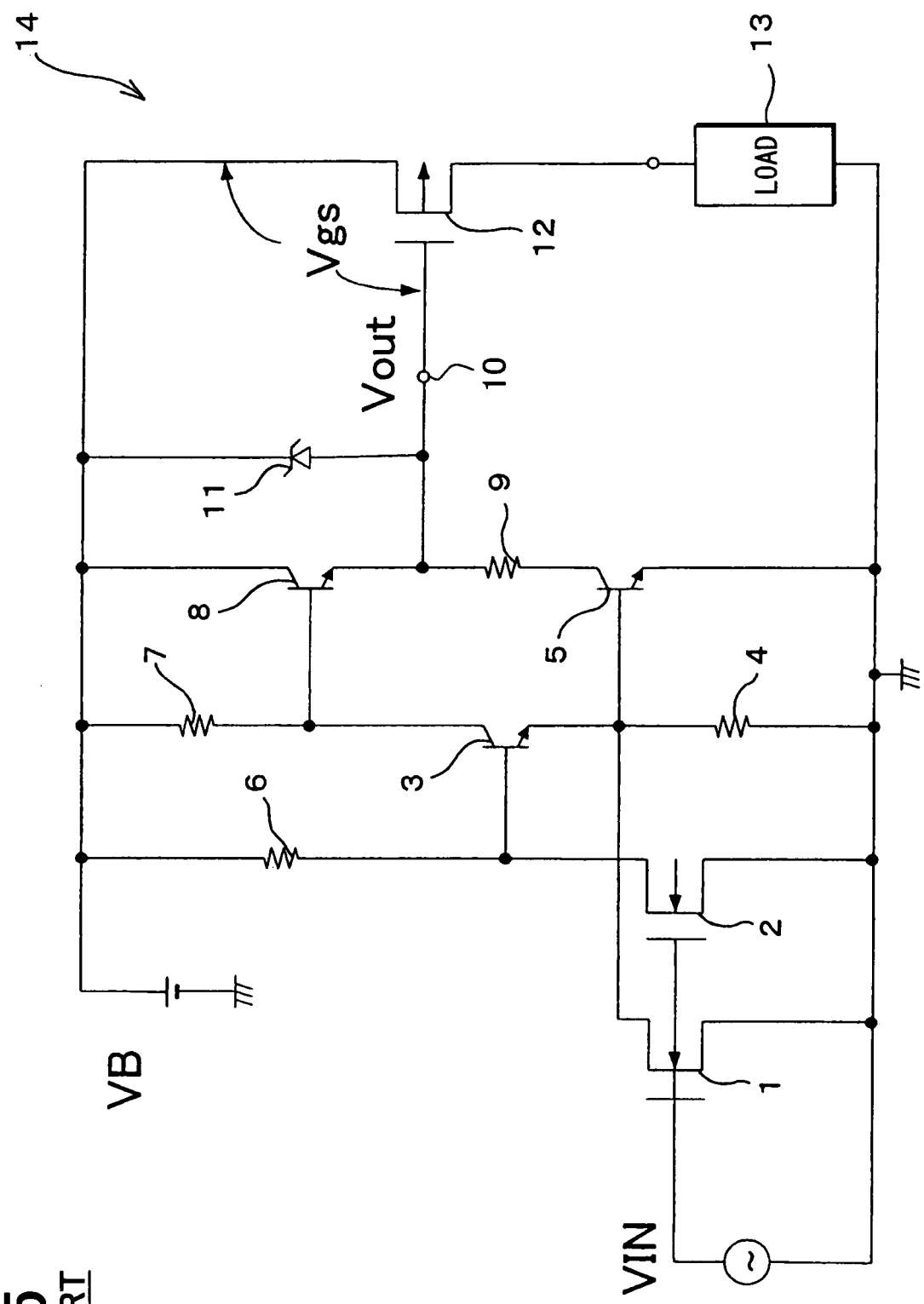
FIG. 5 is a circuit diagram illustrating a conventional drive circuit.
Figure 6:
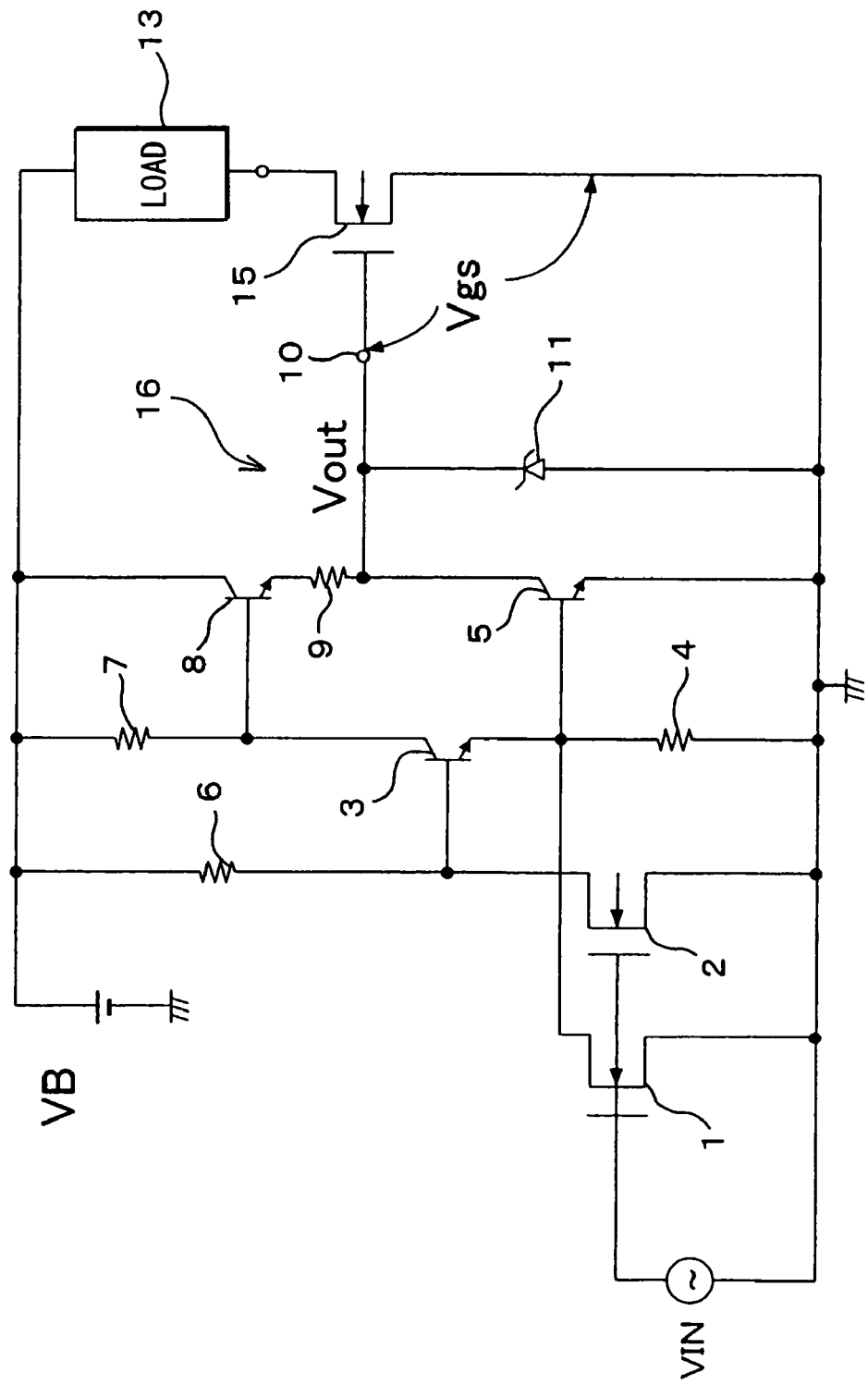
FIG. 6 is a circuit diagram illustrating another conventional drive circuit.
Figure 7:
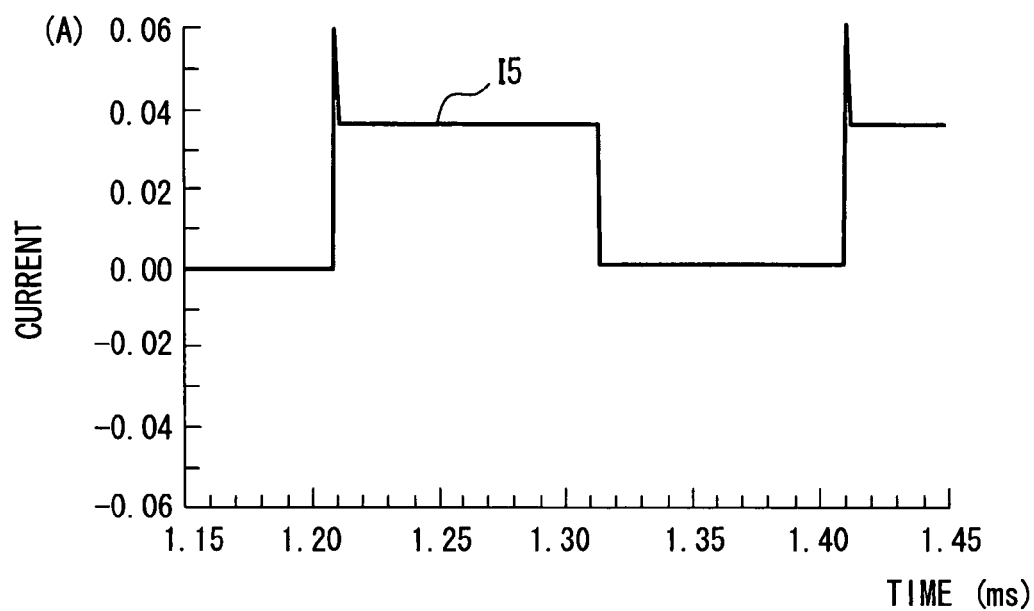
FIGS. 7 and 8 are waveform diagrams illustrating an output current and a gate signal developed in the conventional drive circuit when R5 is 180Ω.

Referring first to FIGS. 1 and 2, a first embodiment of a drive circuit for driving a semiconductor element is applied to a P-channel MOSFET, which is an element to be driven. The first embodiment is an improvement of the conventional drive circuit shown in FIG. 5. Therefore, the same portions as those of the conventional circuit shown in FIG. 5 are denoted by the same reference numerals 1 to 13. It is to be noted however that the resistor 9 in FIG. 6 is not provided in the first embodiment.

In a drive circuit 21 of this embodiment, a series circuit of a resistor 22, a diode 23 and a Zener diode 24 is connected between a power source VB and an output terminal 10, and a Zener diode 25 is connected in parallel with a resistor 22. Further, a series circuit of a P-channel MOSFET 26 (trigger transistor) and a N-channel MOSFET 27 is connected between the power source VB and the ground, and the gate of FET 26 is connected to the anode of diode 23. A N-channel MOSFET 28 (transistor for suppressing current) forms a mirror pair with the FET 27, i.e., forms a current mirror circuit 29. Their gates are connected in common to the drain of FET 27. The drain of FET 28 is connected to the base of transistor 5. Further, a Zener diode 30 is connected between the gates of FETs 27, 28 and the ground. The Zener diodes 25 and 30 are arranged for protecting the FETs 26, 27 and 28.

Further, the above construction added up with the resistor 22, diode 23, Zener diode 24 and FET 26, forms a clamp circuit 45, and the clamp circuit 45 added up with the FET 27 forms a bias circuit 46. Further, the bias circuit 46 added up with the FET 28 forms a current-suppressing circuit 47.

Next, the operation of the embodiment will be described. First, considered below are the conditions of the output voltage Vout of the drive circuit 21, where the FET 26 is turned on at the time of turning the FET 12 (element to be driven) on with the drive control signal VIN of the low level. The resistance of the resistor 22 is R22, the forward voltage of the diode 23 is V23, the Zener voltage of the Zener diode 24 is V24, the threshold voltage of the FET 26 is V26, and the current flowing through the resistor 22 is I22.

Here, the condition for turning on the FET 26 is R22·I22>V26, and there holds a relationship, $$VB - R22 \cdot I22 = Vout + V24 + V23 \tag{1}$$

Since $$R22 \cdot I22 = VB - (Vout + V24 + V23) \tag{2}$$

an output voltage Vout that satisfies, $$VB-(Vout+V24+V23)>V26 \quad (3)$$

becomes $$Vout<VB-(V24+V23+V26) \quad (4)$$

If specific values are given, i.e., VB=15 V, V23=0.7 V, V24=5 V, V26=1.8 V, then, $$Vout<15-(5+0.7+1.8)=7.5\ V$$

Therefore, if the output voltage Vout becomes lower than 7.5 V (limit level), the FET 26 turns on. Here, the diode 23 is arranged to adjust the gate-source voltage Vgs of the FET 12.

If the FET 26 is turned on, a base current is fed to the current mirror circuit 29, and the FET 28 decreases the base current of the transistor 5. That is, if the Zener voltage VZ2 of the Zener diode 11 is set to be about 8 V the output current of the drive circuit 21 can be provided from increasing in a state where the gate-source voltage Vgs of the FET 12 is clamped to 7.5 V. The Zener voltage of the Zener diode 25 may be set to be, for example, about 2.5 V which is slightly greater than the threshold voltage V26 of the FET 26.

Figure 2A:
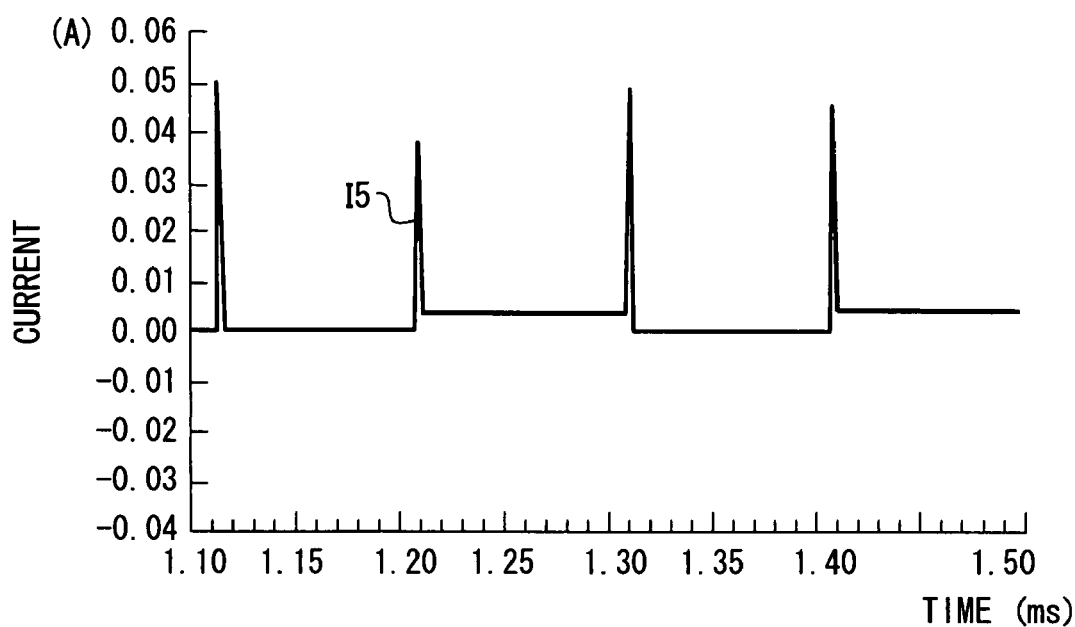
FIGS. 2A and 2B are waveform diagrams illustrating an output current of the drive circuit and gate signal developed in the first embodiment.
Figure 2B:
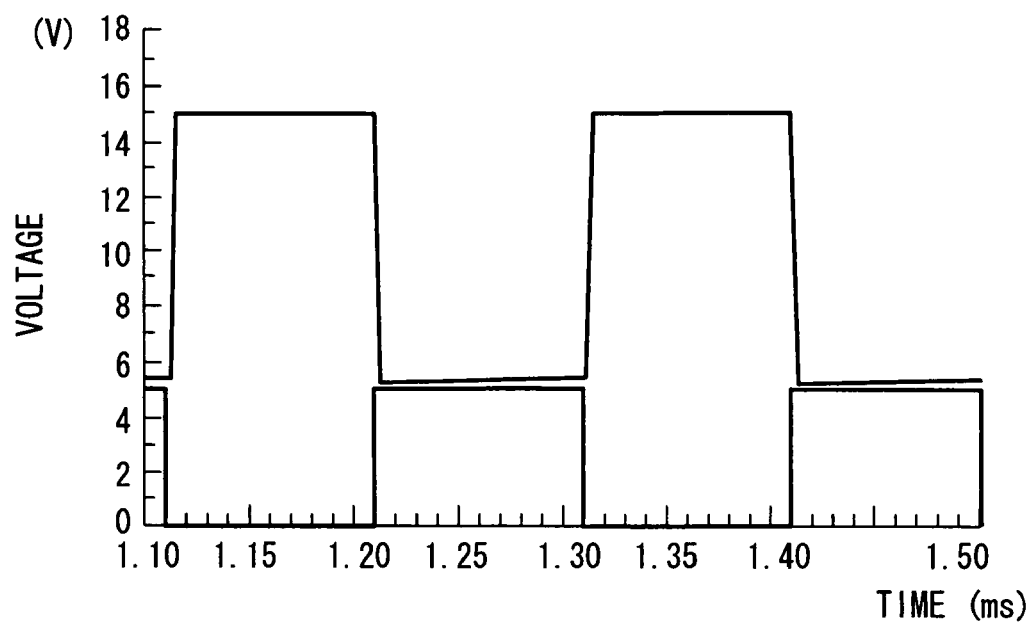
Figure 8:
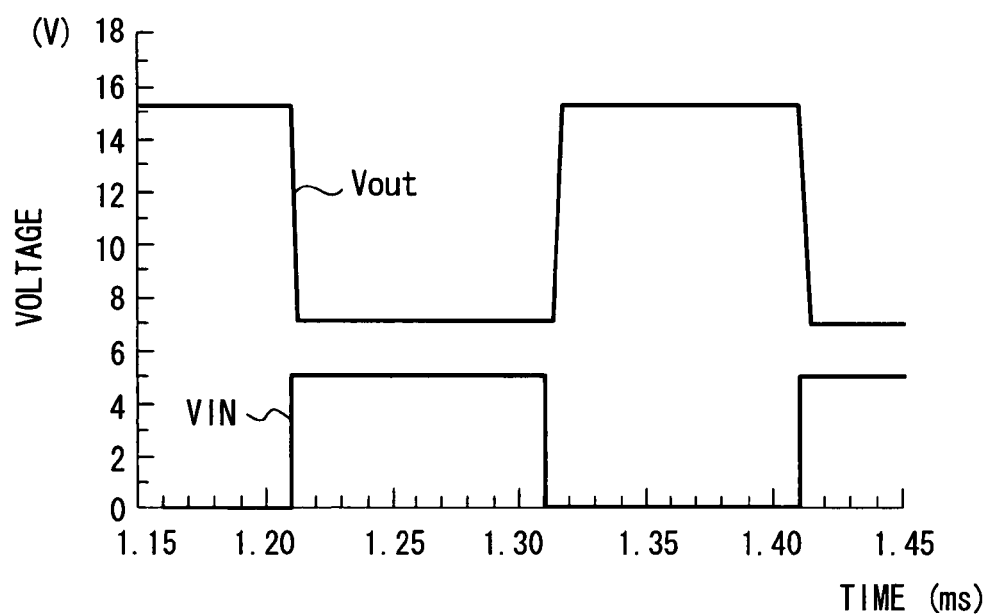
Figure 9:
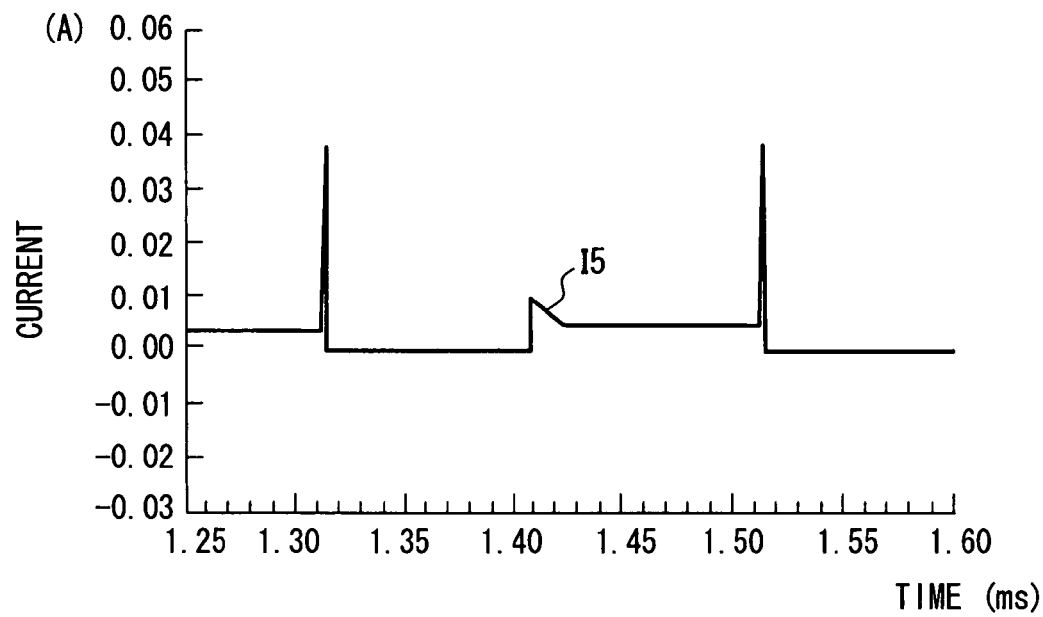
FIGS. 9 and 10 are waveform diagrams illustrating an output current and a gate signal developed in the conventional drive circuit when R5 is 2 kΩ.
Figure 10:
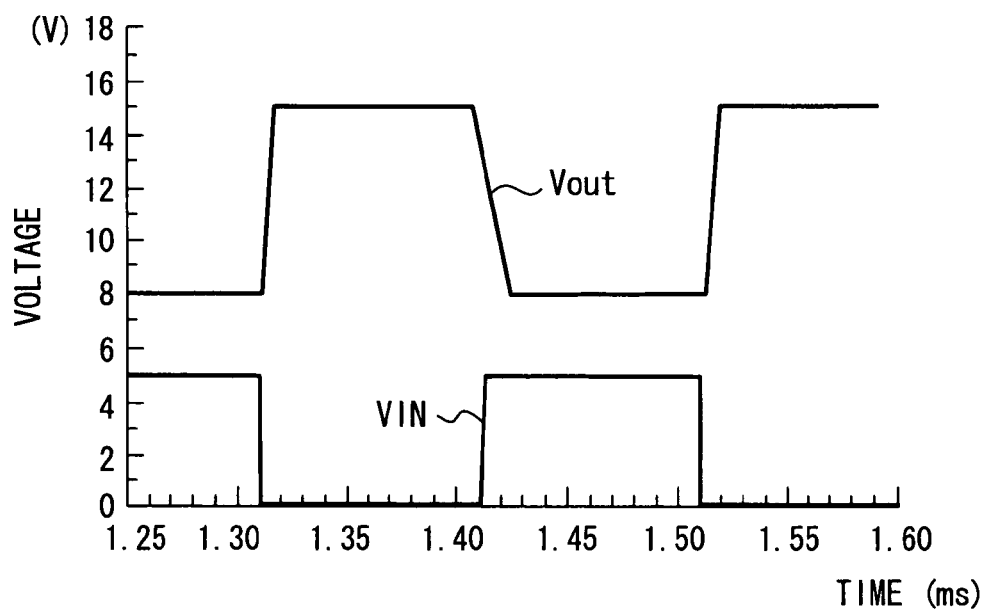

An output current of the drive circuit 21 (collector current I5 of the transistor 5) is shown in FIG. 2A, and an output voltage Vout (gate signal of the FET 12) is shown in FIG. 2B. The output current I5 is provided to be about 3 mA, and the gate signal waveform is not becoming dull but sharp as shown in FIG. 2B when it breaks down, contrary to the conventional case shown in FIG. 8B. It will therefore be obvious that the FET 12 can be switched at a high speed while suppressing the consumption of electric current.

In the drive circuit 21 of this embodiment, if the voltage applied to the FET 12 reaches a limit level in excess of the conduction level of the element, the current suppressing circuit 47 operates to decrease the base current of the transistor 5 (semiconductor element of the ground side) that forms the output stage making it possible to provided the output current (sink current) that flows through the transistor 5. Specifically, if the gate voltage applied to the FET 12 reaches the limit level, the bias circuit 46 renders the FET 28 to be conductive so that the base current of the transistor 5 decreases.

Therefore, the output voltage of the drive circuit 21 can be limited without using the resistor 9 for limiting the current in the output stage. The current suppressing circuit 47 does not operate to provided the current from when the gate voltage applied to the FET 12 has exceeded the conduction level until when it reaches the limit level. Within this range of application voltages, therefore, the FET 12 can be switched at a high speed.

The current suppressing circuit 47 further operates as the clamp circuit 45 for clamping the gate voltage applied to the FET 12 to the limit level. When it is necessary to clamp the applied voltage for suppressing the drive current that flows through the FET 12, therefore, the circuit construction can be further simplified. The clamp circuit 45 increases the amount of current flowing through the resistor 22 as the level of the output voltage (gate voltage) decreases, renders the FET 26 conductive in a step where the terminal voltage thereof increases, and executes the clamping operation by utilizing a constant voltage V26 that generates across the gate and the source (across the input terminal and the output terminal) of the element, making it possible to more efficiently form a circuit that exhibits both the current suppressing function and the voltage clamping function.

According to this embodiment, further, the Zener diodes 25, 30 are connected across the source and the gate of the FET 26, and across the gate and the source of the FET 27 to protect the FETs 26 and 27 from overvoltages.

Second Embodiment

Figure 3:
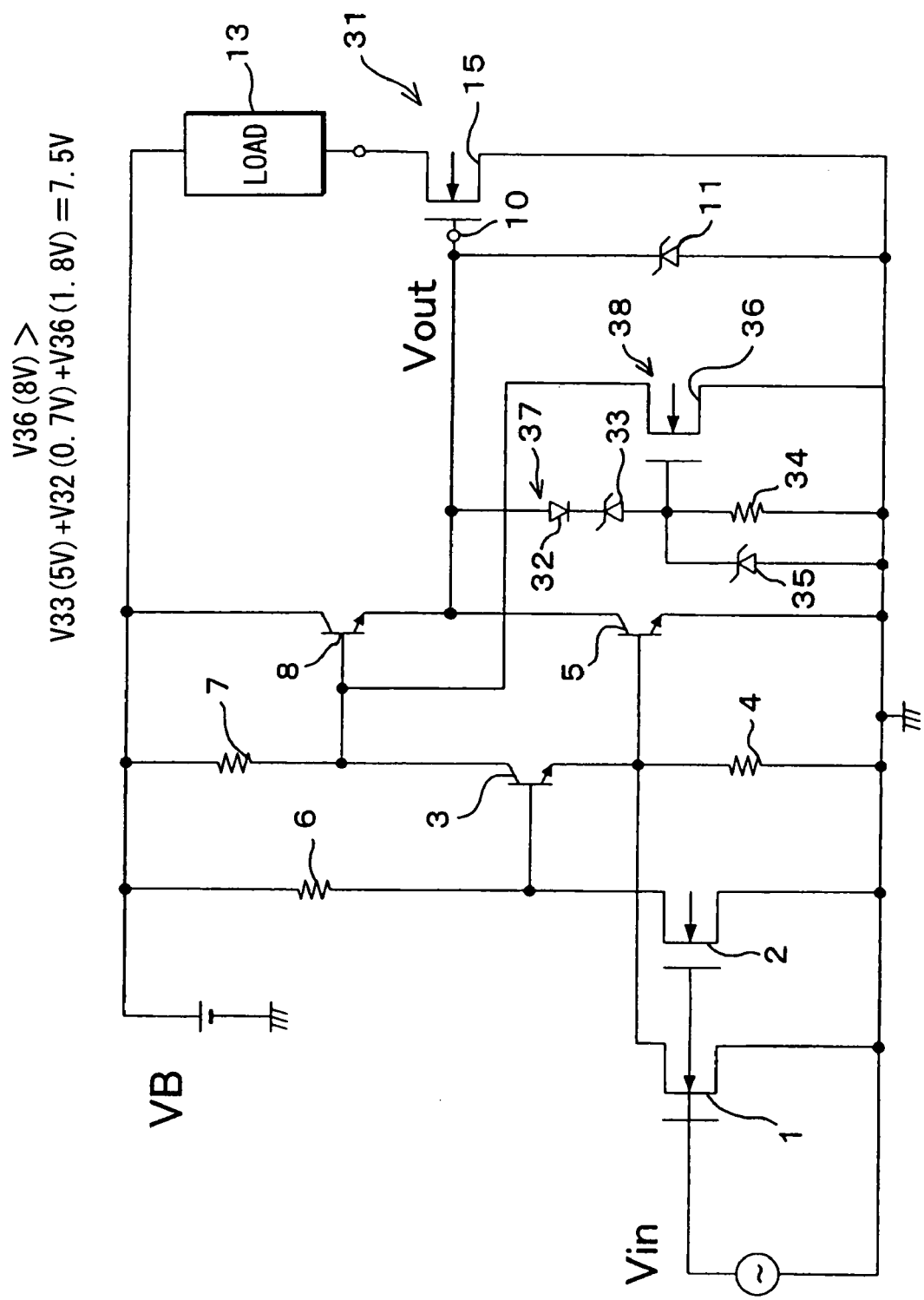
FIG. 3 is a circuit diagram illustrating a drive circuit according to a second embodiment of the present invention.

A second embodiment shown in FIG. 3 is an improvement of the conventional drive circuit shown in FIG. 6. In a drive circuit 31 of the second embodiment, a series circuit of a diode 32, Zener diode 33 and resistor 34 is connected between the output terminal 10 and the ground, and a Zener diode 35 is connected in parallel with the resistor 34. Further, the gate of a N-channel MOSFET 36 for suppressing current is connected to the anode of the Zener diode 33, and the drain of FET 36 is connected to the base of transistor 8, and the source thereof is grounded.

In the above construction, the diode 32, Zener diode 33 and resistor 34 form a bias circuit 37. The bias circuit 37 to which the FET 36 is added forms a clamp circuit (current-suppressing circuit) 38.

Next, the operation of the second embodiment will be described. Considered below are the conditions of the output voltage Vout of the drive circuit 31 where the FET 36 is turned on. The forward voltage of the diode 32 is V32, the Zener voltage of the Zener diode 33 is V33, the resistance of the resistor 34 is R34, the threshold voltage of the FET 36 is V36, and the current flowing through the resistor 34 is I34.

Here, the condition for turning the FET 36 on is R34·I34>V36 and, besides, $$R34\cdot I34=Vout-V32-V33 \quad (5)$$

Therefore, an output voltage Vout that satisfies, $$Vout-V32-V33>V36 \quad (6)$$

becomes $$Vout>V32+V33+V36 \quad (7)$$

If specific values are given, i.e., V32=0.7 V, V33=5 V, V36=1.8 V, then, $$Vout>0.7+5+1.8=7.5V \quad (8)$$

In this case, too, therefore, if the Zener voltage V11 of the Zener diode 11 is set to be about 8 V, the FET 36 is turned on as the output voltage Vout exceeds 7.5 V. If the FET 36 is turned on, a decreased base current flows into the transistor 8 (semiconductor element on the power source side) suppressing an increase in the output current (source current) of the drive circuit 31.

In the drive circuit 31 of this embodiment, if the element to be driven is the P-channel MOSFET 15, the clamp circuit 38 which is the current-suppressing circuit operates to decrease the base current of the transistor 8 that forms the output stage if the voltage applied to the FET 15 reaches the limit level in excess of the conduction level of the element, making it possible to provided the output current that flows through the transistor 8. Specifically, if the gate voltage applied to the FET 15 reaches the limit level, the bias circuit 37 renders the FET 36 to be conductive so that the base current of the transistor 8 decreases. Therefore, the same effect as that of the first embodiment is provided.

In this case, the clamp circuit 38 increases the amount of current flowing through the resistor 34 as the level of the output voltage (gate voltage) increases, renders the FET 36 conductive in a step where the terminal voltage thereof increases, and executes the clamping operation by utilizing a constant voltage VT2 that generates across the gate and the source (across the input terminal and the output terminal) of the element, making it possible to more efficiently form a circuit that exhibits both the current suppressing function and the voltage clamping function.

Third Embodiment

Figure 4:
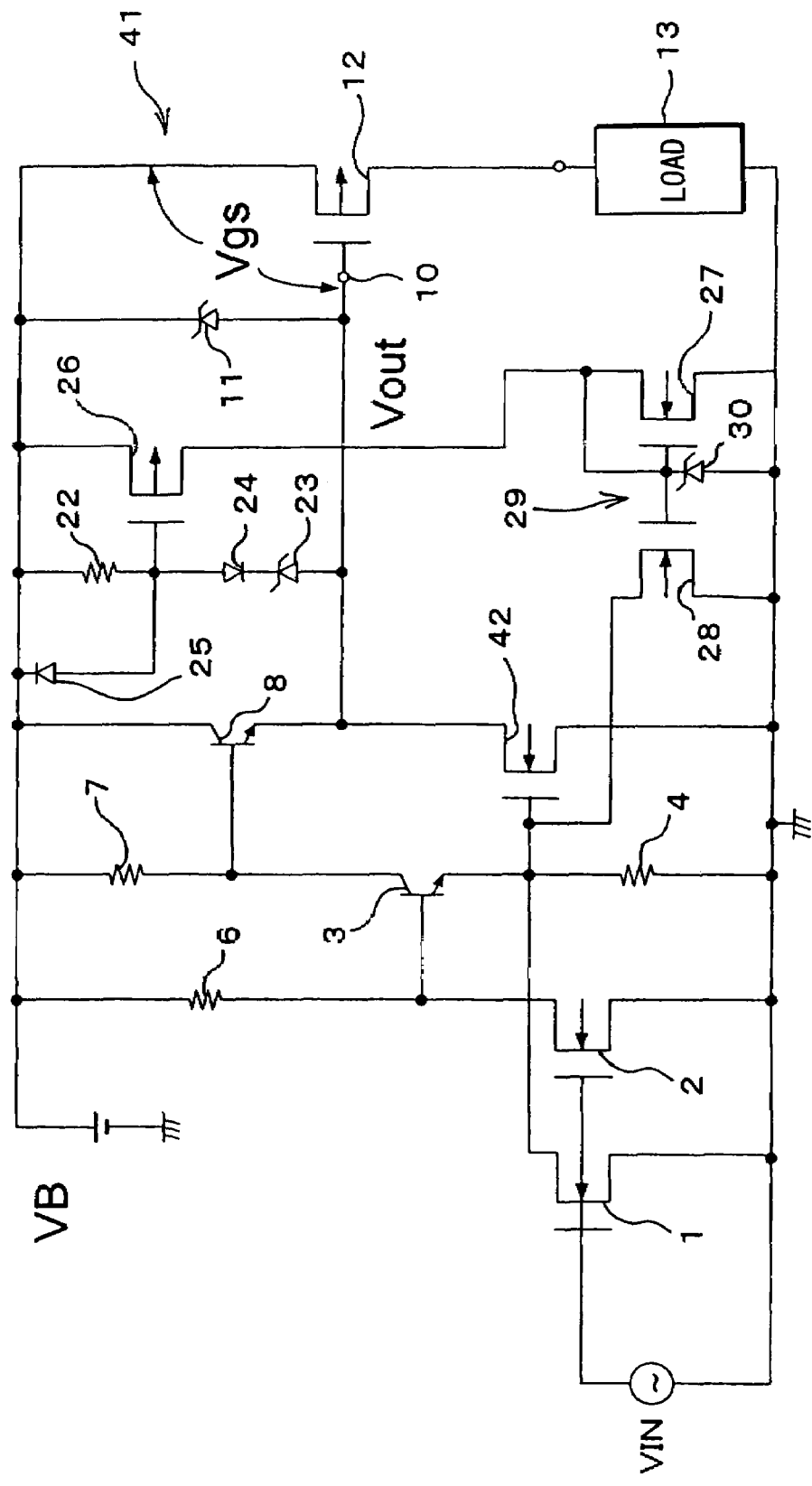
FIG. 4 is a circuit diagram illustrating a drive circuit according to a third embodiment of the present invention.

A third embodiment shown in FIG. 4 is similar to the first embodiment, and differentiated in that a drive circuit 41 has a N-channel MOSFET 42 (semiconductor element on the ground side) in place of the transistor 5 in the drive circuit 21 of the first embodiment.

In operation, the FET 26 is turned on if the output voltage Vout satisfies the condition of the equation (4) at the time when the drive control signal VIN is at the low level causing the FET 12 to be turned on. Then, the current mirror circuit 29 operates and the FET 28 draws part of the current that flows into the resistor 4, causing the gate potential of FET 42 to decrease. Therefore, the output current of the drive circuit 21 decreases. The above construction of the third embodiment, too, exhibits the same operation and effect as those of the first embodiment.

In the first to third embodiments, the diode 23 or 32 may be provided as required and two or more diodes may be provided to suitably adjust the voltage applied to the input terminal of the element to be driven. Further, the Zener voltage of the Zener diode 24 or 33, too, may be suitably varied. The Zener diodes 11, 25, 30, 35 for protection may be connected as required. The bias circuit and the clamp circuit may be formed independently of each other. The element to be driven may be an IGBT. Moreover, the elements that form the drive circuit may be suitably replaced by MOSFETs or bipolar transistors.

Fourth Embodiment

Figure 11:
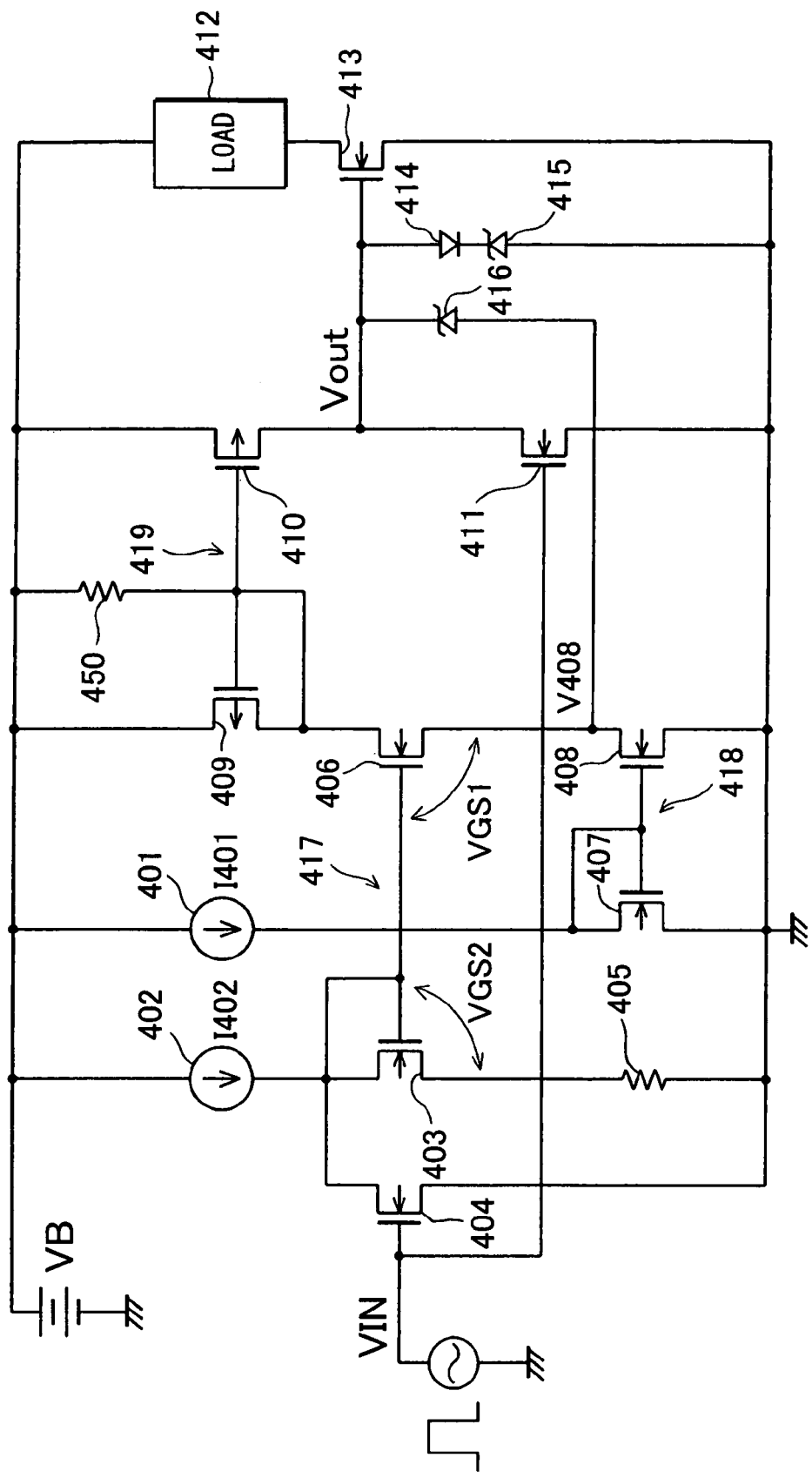
FIG. 11 is a circuit diagram illustrating a drive circuit according to a fourth embodiment of the present invention.

In a fourth embodiment shown in FIG. 11, two current sources 401 and 402 are connected to the positive terminal of the power source VB, and the drains of N-channel MOSFETs 403 and 404 are connected to the side of the current source 402. The source of FET 403 (main transistor) is grounded via a resistor 405 and the source of FET 404 (sub-transistor) is directly grounded. Further, the drain of FET 403 is connected to its gate and is further connected to the gate of a N-channel MOSFET 406.

The current source 401 is grounded via the drain and source of N-channel MOSFET 407, and the gate of FET 407 (main transistor) is connected to its drain and to the gate of N-channel MOSFET 408. The drain of FET 408 (sub-transistor) is connected to the source of FET 406, and the source of FET 408 is grounded. The sources of two P-channel MOSFETs 409 and 410 are connected to the positive terminal of the power source VB, and the gates thereof are connected to the drain of FET 409 (main transistor) and to the drain of FET 406. Further, the gates of FETs 409 and 410 are connected to the positive terminal of the power source VB through a resistor 450.

The drain of FET 410 (sub-transistor) is connected to the drain of N-channel MOSFET 411, the source of FET 411 is grounded and the gate thereof is connected to the gate of FET 404. A series circuit of a load (e.g., resistor and inductance) 412 and a N-channel MOSFET 413, which is the element to be driven, is connected between the positive terminal of power source VB and the ground. The gate of FET-413 is connected to the drains of FETs 410 and 411.

The FET 413 is, for example, a power MOSFET A series circuit of a diode 414 and a Zener diode 415 is connected between the gate of FET 413 and the ground. The diode 414 and the Zener diode 415 are connected in reverse in polarity to each other. The gate of FET 413 is connected to the cathode of Zener diode 416 (constant voltage element), and the anode of Zener diode 416 is connected to the drain of FET 408.

The drive control signal VIN is input to the gates of FETs 404 and 411. A pair of FETs 403 and 406 form a mirror pair 417 on the input side. A pair of FETs 407 and 408 form a mirror pair 418 for determining current. A pair of FETs 409 and 410 form a mirror pair 419 on the output side. The drive circuit 420 is connected to drive the load 412 through the FET 413.

In operation, if the drive control signal VIN is at a high level, the FETs 404 and 411 are both turned on, and the FETs 403 and 406 are both turned off. Accordingly, the FETs 409 and 410 are turned off, the gate potential Vout of FET 413 assumes the low level, the FET 413 is turned off, and no current is fed to the load 412.

If the drive control signal VIN is at a low level, on the other hand, the FETs 404 and 411 are both turned off, and the FETs 403 and 406 are both turned on. Therefore, the FETs 409 and 410 are turned on. As a result, the output signal Vout (gate potential of FET 413) assumes the high level, and the FET 413 is turned on to supply a current to the load 412. Here, if it is presumed that the Zener diode 416 is not provided, a current flows into the diodes 414 and 415 through the FET 410 provided the voltage VB is, $$VB > V414 + V415 \quad (9)$$

where V414 is a forward voltage of the diode 414, and V415 is a Zener voltage of the Zener diode 415.

If the frequency of the drive control signals VIN is on the order of several hundred kHz, a current flowing through the FET 410 becomes about 100 mA provided the input capacity of FET 413 is about 100 pF, and nearly all of the current flows as a useless current into the ground through the diodes 414 and 415.

This embodiment employs the Zener diode 416. If the voltage VB becomes, $$VB > V408 + V415 \quad (10)$$

due to the provision of Zener diode 416, then the current flows into the FET 408 through the Zener diode 416. Here, V408 is a drain potential of FET 408 and V416 is a Zener voltage of Zener diode 416. Here, if the current flowing into the FET 408 is denoted by I408, then, $$I408 = I416 + I401 \quad (11)$$

where I416 is a current flowing into the Zener diode 416 and I401 is a constant current supplied by the current source 401. Namely, as represented by the equation (11), a current drawn by the FET 408 from the FET 409 decreases by the amount of current I416 flowing into the drain thereof. Accordingly, the output current that flows via the FET 410 decreases correspondingly. Namely, a negative feedback acts on the output current.

Further, the output voltage Vout is clamped at, $$Vout = V408 + V416 \quad (12)$$

Here, the drain potential V408 of FET 408 is expressed by the equation (13), $$V408 = VGS2 + R405 \times I402 - VGS1 \quad (13)$$

where VGS2 and VGS1 are gate-source voltages of the FETs 403 and 406 as expressed below, R405 is a resistance of the resistor 405, and I402 is a constant current supplied by the current source 402.

$$VGS1=(2\times I1/\beta)^{1/2} \quad (14)$$

$$VGS2=(2\times I2/\beta)^{1/2} \quad (15)$$

$$\text{where } \beta=(\mu\times Cx\times W)/L \quad (16)$$

μ is a mobility of electrons of the FET, Cx is a capacity of the gate oxide film, W is a channel width, an L is a channel length.

Therefore, if the constant currents I401 and I402 of the current sources 401 and 402 are set to be equal to each other, then $$V408=R405\times I402 \quad (17)$$

That is, if the resistor 405 is formed by a thin-film resistor having no temperature dependency and if the current source 402, too, is formed having neither temperature dependency nor voltage dependency, the clamp voltage Vout can be liberated from the effect caused by variation in the temperature and fluctuation in the power source VB. A constant current circuit having the above characteristics is known.

To turn the FET 413 on, a constant current I402 is supplied from the constant current source 402 to the resistor 405 depending upon the input signal VIN, and a current that flows through the gate of FET 413 is determined by the mirror pair 419 on the output side. Further, the Zener diode 416 is connected between the above gate and a potential point (drain of FET 408) which becomes equal to the terminal voltage of the resistor 405 in the current path on the side of FET 409 of the mirror pair 419 on the output side, to thereby form a negative feedback path for flowing a current into the above potential point through the gate of FET 413.

Therefore, the gate potential of FET 413 can be clamped to the terminal voltage (=V408) of the resistor 405 to which a constant voltage VZD416 generated by the Zener diode 416 is added. The constant current source 402 is formed by a circuit having neither the temperature dependency nor the voltage dependency, and the resistor 405 is formed by an element having no temperature dependency, liberating the clamped voltage from the effect caused by variation in the power-source voltage and in the temperature. Thus, the load current that flows through the FET 413 is maintained nearly constant.

Further, the output stage of the drive circuit 420 is formed by connecting two FETs 410 and 411 in series, and the gate of FET 413 is connected to a common connection point thereof, and the FET 410 is rendered to operate as a sub-transistor of the mirror pair 419 on the output side. Therefore, a current that flows through the gate when the FET 413 is turned on becomes a mirror current of the current that flows through the FET 409 of the mirror pair 419 on the output side, and a current that flows through the gate of FET 413 and the Zener diode 416 meets the current that flows through the FET 409. Therefore, the drive current that flows during the clamping operation is provided by a current that is fed back to the side of FET 409 through the Zener diode 416.

Further, since the above potential point is disposed between the FET 409 and the FET 408 in the mirror pair 418 for determining the current, a current that flows through the FET 409 in the mirror pair 419 on the output side can be determined by the constant current I1 from which a current flowing through the Zener diode 416 is subtracted. Moreover, the resistor 405 is connected in series with the source of FET 403 that forms the mirror pair 417 on the input side, and the FET 406 that forms the mirror pair 17 on the input side is arranged between the FET 409 and the FET 408, making it possible to determine the current flowing into the mirror pair 419 on the output side depending upon the two constant currents I1 and I402.

The terminal voltage of resistor 405 becomes equal to the source potential of FET 403 that forms the mirror pair 417 on the input side, and the source potential of FET 406 becomes equal to a threshold voltage of FETs 403, 406 to which VGS2, VGS1 are added or from which VGS2, VGS1 are subtracted. By setting the two constant currents I401 and I402 to be equal to each other, therefore, the source of FET 406 becomes a potential point that is equal to the terminal voltage of the resistor 405.

Fifth Embodiment

Figure 12:
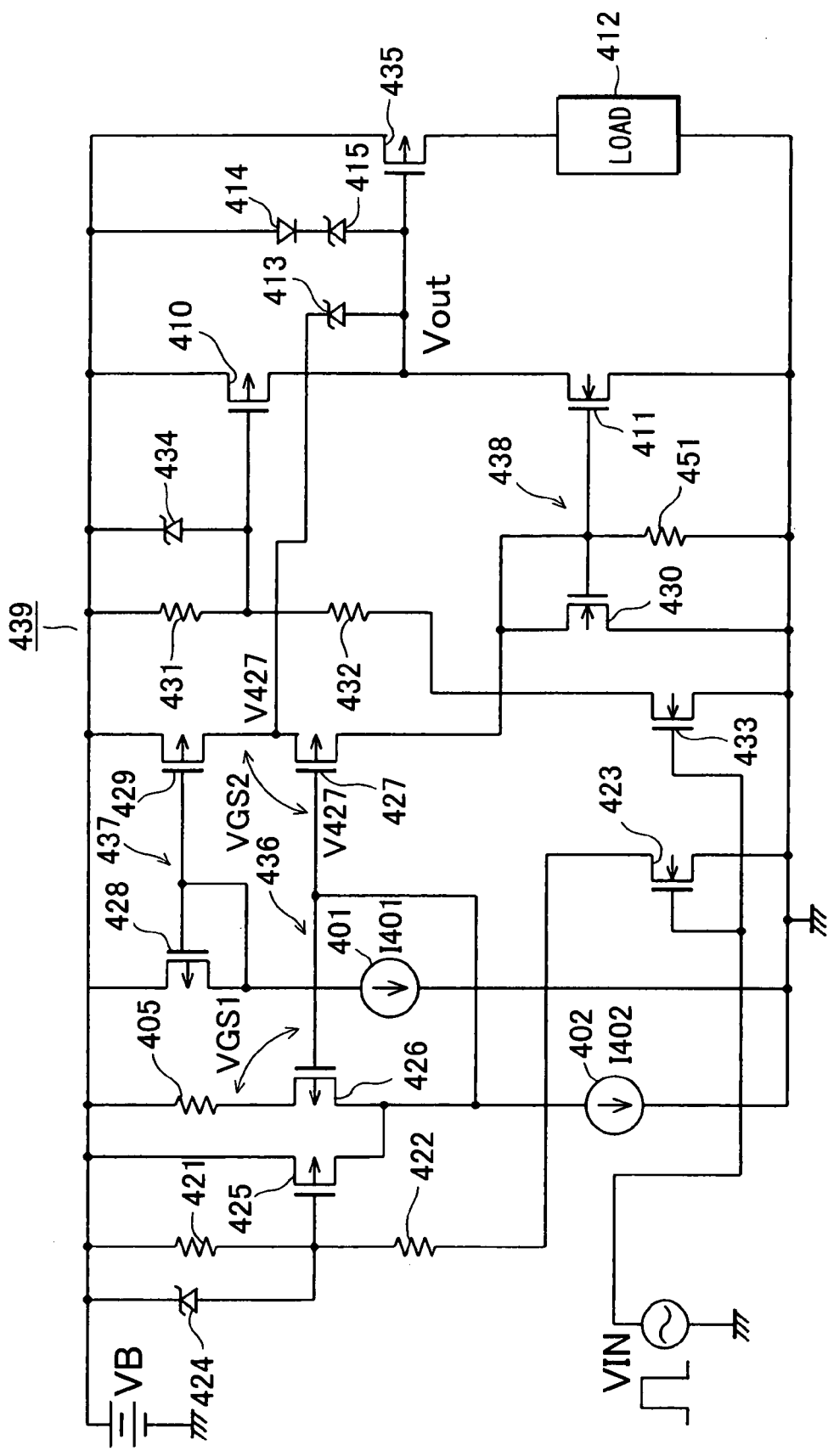
FIG. 12 is a circuit diagram illustrating a drive circuit according to a fifth embodiment of the present invention.
Figure 13:
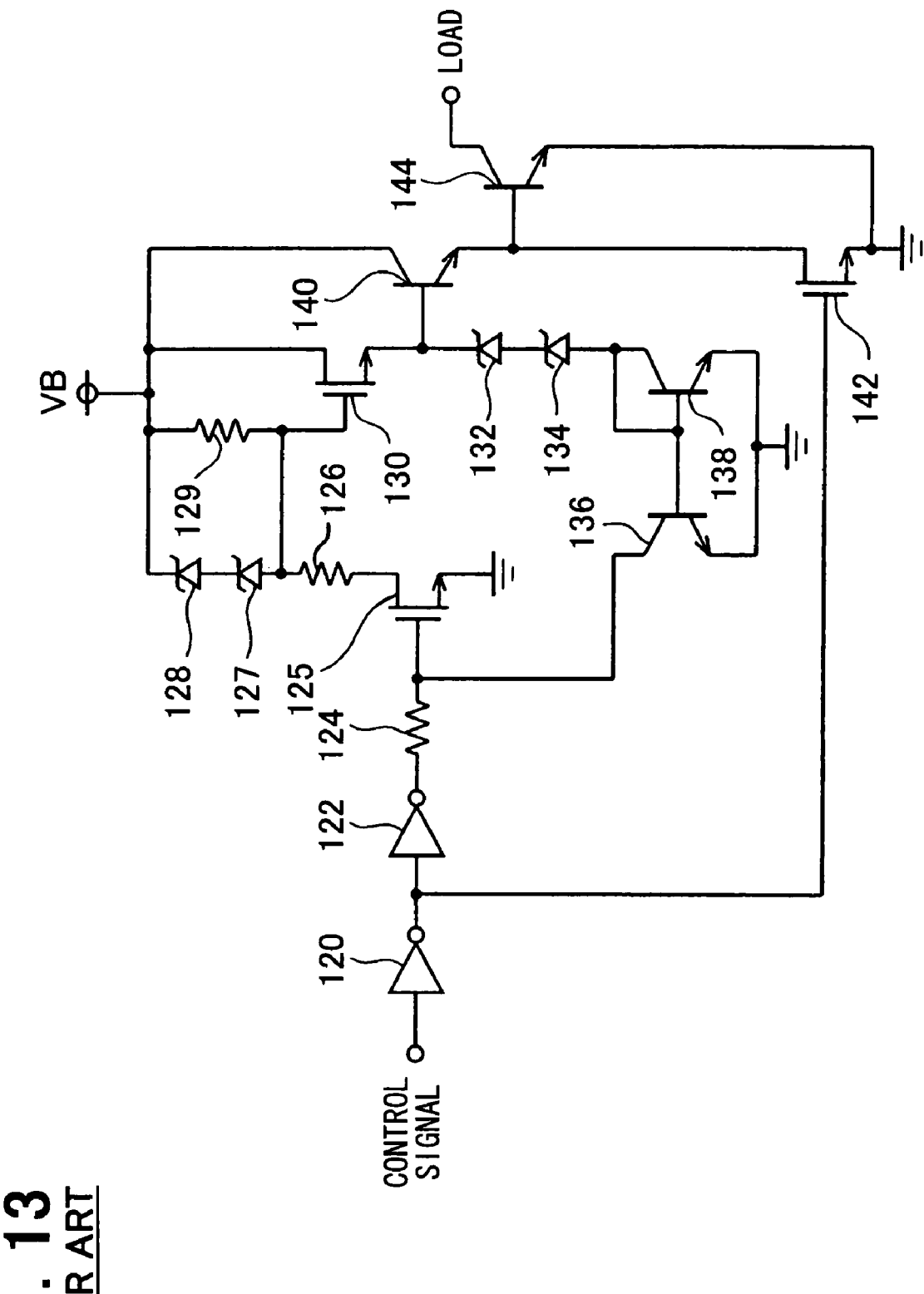
FIG. 13 is a circuit diagram illustrating a further conventional drive circuit.

In a fifth embodiment shown in FIG. 12, the semiconductor element to be driven is a P-channel MOSFET 435.

A series circuit of resistors 421, 422 and N-channel MOSFET 423 is connected between the positive terminal of the power source VB and the ground. A Zener diode 424 for clamping is connected in parallel with the resistor 421. The source of P-channel MOSFET 425 is connected to the power source VB, and the drain of FET 425 is grounded via the constant current source 402. Further, the gate of FET 425 is connected to a common connection point of the resistors 421 and 422.

A series circuit of resistor 405 and P-channel MOSFET 426 (main transistor) is connected in parallel with the FET 425, and the gate of FET 426 is connected to its drain together with the gate of P-channel MOSFET 427 (sub-transistor). The sources of P-channel MOSFTs 428 and 429 are connected to the positive terminal of the power source VB, and the gates thereof are connected in common to the drain on the side of FET 428 (main transistor).

The drain of FET 428 is grounded via the constant current source 401. On the other hand, the drain of FET 429 (sub-transistor) is connected to the source of FET 427, and the drain of FET 427 is connected to the drain of N-channel MOSFET 430 (main transistor) which forms a mirror pair together with the FET 411 (sub-transistor) and is, further, connected to the gates of FETs 411 and 430. A resistor 451 is connected between the gates of FETs 411, 430 and the ground.

Further, a series circuit of resistors 431, 432 and N-channel MOSFET 433 is connected between the positive terminal of the power source VB and the ground, and drive control signals VIN are supplied to the gate of FET 433 as well as to the gate of FET 423. The gate of FET 410 is connected to a common connection point of the resistors 431 and 432, and a Zener diode 434 is connected in parallel with the resistor 431 to clamp the gate potential of FET 410.

A series circuit of the P-channel MOSFET 435 and the load 412 is connected between the positive terminal of the power source VB and the ground. The gate of FET 435 is connected to the drains of FETs 410 and 411. A series circuit of the diode 414 and the Zener diode 415 is connected between the positive terminal of the power source VB and the gate of FET 435, and a Zener diode 413 is connected between the source of FET 427 and the gate of FET 435. A negative feedback path for the drive current is thus formed.

In the above construction, a pair of FETs 426 and 427 form a mirror pair 436 on the input side, a pair of FETs 428 and 429 form a mirror pair 437 for determining the current, and a pair of FETs 430 and 411 form a mirror pair 438 on the output side. The drive circuit 439 is thus connected to the load 412 through the FET 435.

In operation, if the drive control signal VIN is at the high level, FETs 423 and 433 are turned on. Then, the gate potential of FET 425 assumes the low level and the FET 425 is turned on causing the FET 426 to be turned off. Therefore, the FET 427, too, is turned off, and the gate potential to the FETs 430 and 411 assumes the low level; i.e., the FETs 430 and 411 are turned off. Here, since the FET 433 is turned on, the FET 410 is turned on. As a result, the gate potential Vout to the FET 435 assumes the high level; i.e., the FET 435 is turned off and no current is supplied to the load 412.

On the other hand, if the drive control signal VIN is at the low level, the FETs 423 and 433 are turned off. Then, the gate potential of FET 425 assumes the high level and the FET 425 is turned off causing the FET 426 to be turned on. Therefore, the FET 427, too, is turned on, and the gate potential to the FETs 430 and 411 assumes the high level; i.e., the FETs 430 and 411 are turned on. Here, since the FET 433 is turned off, the FET 410, too, is turned off.

As a result, the output voltage Vout (gate potential to the FET 435) assumes the low level; i.e., the FET 435 is turned on and a current is supplied to the load 412. Here, if the source potential (potential point) of the FET 427 is denoted by V427 and the Zener voltage of the Zener diode 413 is denoted by V413, the gate voltage Vout of FET 435 is given by, $$V\text{out}=V427-V413 \tag{18}$$

Due to the same principle as that of the first embodiment, the source potential V427 of FET 427 is equal to the source potential of FET 426, i.e., $$V427=VB-R405\cdot I402 \tag{19}$$

Therefore, the gate potential Vout of FET 435 is clamped to be, $$V\text{out}=VB-R405\cdot I402-V413 \tag{20}$$

Further, part of the current flowing through the FET 429 is branched as the current I413 that flows through the Zener diode 413. Therefore, the current flowing into the mirror pair 438 on the output side decreases by the current I413. Accordingly, the output current that flows through the FET 411 decreases, and the negative feedback acts on the output current.

As described above, the fifth embodiment exhibits the same effect as that of the fourth embodiment even when the element to be driven is the p-channel MOSFET 435.

In the fourth and the fifth embodiments, the FETs may be suitably replaced by bipolar transistors and the element to be driven may be an IGBT.

What is claimed is:

1. A drive circuit for driving a voltage-driven semiconductor element having a conduction control terminal depending upon an input signal, the drive circuit comprising:
    a constant current source for supplying a constant current;
    a resistor supplied with the constant current depending upon the input signal;
    an output mirror pair including a first input transistor and a first output transistor connected to the conduction control terminal for determining a current flowing through the conduction control terminal of the semiconductor element; and
    an intermediate mirror pair including a second input transistor and a second output transistor;
    a constant voltage element connected between the conduction control terminal and a potential point that becomes equal to a terminal voltage of the resistor on a current path of the first input transistor, the constant voltage element forming a negative feedback path for a current that flows through the conduction control terminal,
    wherein the intermediate mirror pair is connected to the constant voltage element, and
    wherein the potential point is disposed between the first input transistor and the second output transistor for determining a current that flows through the second input transistor based on the constant current source.

2. The drive circuit according to claim 1, wherein:
    an output stage of two semiconductor elements connected in series is provided, and the conduction control terminal of the voltage-driven semiconductor element is connected to a common connection point of the two semiconductor elements; and
    one of the two semiconductor elements in the output stage is the first output transistor.

3. The drive circuit according to claim 1, wherein:
    an input mirror pair including a third input transistor and a third output transistor is provided to receive the input signal;
    the resistor is connected in series with the third input transistor, the state of conduction of which varies depending upon a change in the input signal; and
    the third output transistor is disposed between the first input transistor and the second output transistor.

4. The drive circuit according to claim 3, wherein the input mirror pair includes MOSFETs, and the resistor is connected to a source of one of the MOSFETs.

* * * * *